United States Patent [19]

Cowley

[11] Patent Number: 4,953,010
[45] Date of Patent: Aug. 28, 1990

[54] FM DEMODULATOR INCLUDING INJECTION LOCKED OSCILLATOR/DIVIDER

[75] Inventor: Nicholas P. Cowley, Wiltshire, England

[73] Assignee: Plessey Overseas Limited, Ilford, England

[21] Appl. No.: 301,382

[22] Filed: Jan. 25, 1989

Related U.S. Application Data

[63] Continuation-in-part of Ser. No. 6,652, Mar. 9, 1987, abandoned.

[51] Int. Cl.[5] .............................. H04N 5/44
[52] U.S. Cl. ....................... 358/35; 358/23; 358/191.1; 455/216
[58] Field of Search ............. 358/35, 23, 24, 191.1, 358/195.1; 455/188, 214, 216, 312, 311

[56] References Cited

U.S. PATENT DOCUMENTS

| | | | |
|---|---|---|---|
| 3,334,301 | 8/1967 | Sarkany | 358/35 |
| 4,531,148 | 7/1985 | Ohta | 358/23 |
| 4,608,539 | 8/1986 | Lawton | 455/216 |
| 4,766,391 | 8/1988 | McGinn | 358/23 |
| 4,806,872 | 2/1989 | Cowley | 455/216 |

*Primary Examiner*—Tommy P. Chin
*Attorney, Agent, or Firm*—Fleit, Jacobson, Cohn, Price, Holman & Stern

[57] ABSTRACT

An FM demodulator comprises an injection locked oscillator/divider for receiving an input signal to be demodulated. The injection locked oscillator/divider is coupled via a divider to a frequency discriminator, such as a quadrature demodulator, for providing a demodulated output signal. A feedback loop is provided to afford the demodulated output signal to a varactor tuning circuit of the injection locked oscillator/divider so that the center frequency of the injection locked oscillator/divider is constrained to correspond with the frequency of the input signal. The FM demodulator provides improved threshold extension and demodulated video bandwidth.

6 Claims, 2 Drawing Sheets

FM DEMODULATOR INCLUDING INJECTION LOCKED OSCILLATOR/DIVIDER

The application is a continuation-in-part of my prior application, U.S. Ser. No. 006,652 filed Mar. 9, 1987 in the name of Nicholas P. Cowley now abandoned.

FIELD OF THE INVENTION

The present invention relates to demodulators for frequency modulated signals, known as FM demodulators, and relates particularly though not exclusively to FM demodulators for use in satellite television reception.

BACKGROUND OF THE INVENTION

Various reception problems are encountered in receiving signals from satellites wherein an incoming signal having a frequency of about 2 GHz carries a video signal which is to be recovered. A typical arrangement is shown in FIG. 1. A satellite receiver dish 2 is coupled to a head end processing unit 4 which is mounted close to the dish, out of doors. Unit 2 is coupled via a long coaxial cable 6 to an indoor processing unit 8. Head end processing unit 4 comprises a low noise amplifier 10 and a mixer 12 for mixing the incoming signal with a signal from a local oscillator 14, in order to generate an intermediate frequency (IF) of between 70–612 MHz for transmission along cable 6. An IF of this value permits transmission to the indoor processing unit by cable 6 which is relatively long. The indoor unit 8 comprises an IF amplifier 16, a bandpass filter 18, a further IF amplifier 20, an FM discriminator 22 and a video amplifier 24. Thus the indoor unit filters the incoming IF signal, demodulates the video signal carried thereon in demodulator 22 and provides a video output signal from amplifier 24.

The choice of intermediate frequency is one of the main areas of disagreement between designers, some using a value of 70 MHz since this is an existing standard in microwave link communications and hence the processing techniques are well proven. However, the 612 MHz option has advantages in greater demodulator linearity (due to the lower percentage deviation) and a more simple design (because the inherently higher image rejection makes tracking filters unnecessary). Since it is nowadays possible to make demodulators for frequencies up to 600 MHz at relatively low costs, the 600 MHz option is nowadays preferred.

A further problem arises in fringe reception areas where noise becomes a major problem. In particular, FM demodulators which utilise a frequency discriminator such as a quadrature demodulator exhibit a threshold level below which they are unable to function satisfactorily. The threshold level is the carrier signal to noise signal ratio in the FM signal to be demodulated where the noise begins to introduce characteristic FM noise into the demodulated signal. For FM video signals this characteristic FM noise can produce sparklies into the demodulated video picture and so, degrades the video quality making it unsuitable for most applications.

Hence, threshold extension techniques have been proposed for satellite communcation systems. Threshold extension is a method of extending the carrier signal to noise signal ratio into an increasingly noisy signal whilst maintaining the same quality output signal as obtained from higher carrier to noise signal ratios.

Methods of threshold extension have been proposed employing complex and expensive phase locked loops. Whilst these have operated satisfactorily, they are nevertheless expensive.

My copending application USSN 06/868,908 filed May 29, 1986 entitled Frequency Modulation Receiver Employing Frequency Divider and granted as U.S. Pat. No. 4,806,872 discloses the use of an injection locked oscullator/divider (ILO/D) preceding a quadrature discriminator. An injection locked oscillator/divider is a mixer/oscillator combination whose natural frequency, genrally known as the centre frequency, is equal to or a sub harmonic of the input carrier frequency. The FM signal to be demodulated is injected into the mixer input port of the device and, provided the frequency deviation of the input signal is not excessively high, an oscillator harmonic will tend to phase lock to the FM input signal. The maximum possible deviation in the output signal from the injection locked oscillator/divider centre frequency is proportional to the power of the input signal. Hence, threshold extension is obtained which is proportional to the power of the input signal.

SUMMARY OF THE INVENTION

It is an object of the invention to provide an FM demodulator which responds to intermediate frequencies of between 70 MHz and 600 MHz from a satellite receiver dish and is able to operate satisfactorily in fringe reception areas.

It is a further object of the invention to provide an FM demodulator which incorporates an injection locked oscillator/divider for locking to an incoming IF signal.

In one aspect, the invention provides a demodulator for frequency modulated signals, the demodulator comprising an injection locked oscillator/divider, the oscillator divider comprising a mixer/oscillator combination having a centre frequency of operation and having an input terminal for receiving an input signal to be demodulated, the oscillator/divider having an output terminal means for providing an output signal which is phase locked to the input signal and is a frequency divided version thereof, a frequency divider coupled to said output terminal means for dividing the frequency of said output signal, a frequency discriminator coupled to the frequency divider for providing a demodulated output signal, a feedback loop for affording a feedback signal, dependent upon the demodulated output signal, and a tuning circuit means responsive to the feedback signal and coupled to the injection locked oscillator/divider for constraining the centre frequency thereof to track the frequency of the input signal.

In a further aspect the invention provides an FM demodulator for VHF signals the demodulator comprising:

(1) an injection locked oscillator/divider, the oscillator/divider comprising a mixer means having an input port for receiving an input IF signal, an output port means providing an output signal, a feedback path for feeding back the output signal to the mixer means for mixing the output signal with the input IF signal, a resonant circuit coupled to the output port means for determining the centre frequency of the oscillator/divider;

(2) a discriminator coupled for demodulating said output signal to provide a demodulated signal;

(3) feedback path means coupled to receive said demodulated signal and to provide a feedback signal; and (4) tuning circuit means coupled to said resonant circuit of the oscillator/divider and responsive to said feedback signal for varying the centre frequency of the oscillator/divider whereby the centre frequency tracks the input IF signal.

In a further aspect the invention provides an FM demodulator for VHF signals, the demodulator comprising an injection locked oscillator/divider, the injection locked oscillator/divider comprising a transconductance mixer means having an input port means for receiving an input IF signal, a current injection means coupled to the input port means, amplifying means comprising first and second transistors connected in common emitter configuration with said current injection means forming a common emitter load, and output port means coupled to the collector of said first transistor to provide an output signal, a feedback path coupling the collector of said first transistor to the base of the second transistor to feedback the output signal to the transconductance mixer means, to mix the output signal with the input IF signal, and a resonant circuit coupled to the output port means including capacitance means for selecting the centre frequency of operation of the oscillator/divider.

BRIEF DESCRIPTION OF DRAWINGS

The present invention will now be described by way of example with reference to the accompanying drawing in which.

Figure 1:
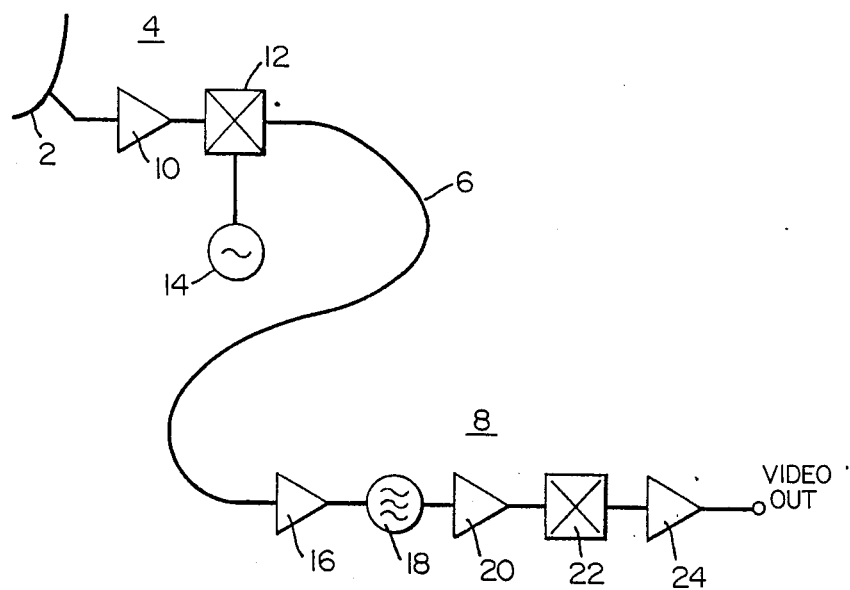
FIG. 1 is a block schematic diagram of a known type of satellite signal receiver.

The present invention will now be described, by way of example, with reference of FIGS. 2 and 3.

The FM demodulator comprises an injection locked oscillator/divider (ILO/D) 32, having a mixer input port 34 for an IF input signal and a varactor diode tuning circuit 36 for receiving a feedback signal, comprising an FM demodulated video signal. The injection locked oscillator/divider 32 is coupled via a divider 38 to a frequency discriminator, such as a quadrature demodulator 40 for demodulating the IF input signal. The output of the quadrature demodulator 40 is coupled to an amplifier 42, the output of which provides the output signal from the FM demodulator. A filter 44 is provided for filtering the harmonics and sub-harmonics of the output signal from the quadrature demodulator 40 which lie outside the desired pass band of the demodulator. A feedback loop 46 is provided, which comprises a loop amplifier 48 coupled to a loop filter 50, for providing a feedback signal to the varactor tuning circuit 36 of the injection locked oscillator/divider 32, which feedback signal is dependent upon the demodulated output signal from the quadrature demodulator 40. The loop filter 50 is designed to have a bandpass transfer function and whose phase shift at critical frequencies, such as the subcarrier frequencies in subcarrier television modulation type signals, is arranged to cancel the phase shift introduced by delays within the FM demodulator.

Typically, the subcarrier television modulation type signal is the chroma sub-carrier signal in a PAL television signal.

In more detail, amplifier 48 comprises first and second transistors Tr1 and Tr2, the output signal on line 46 being taken from the collector of transistor Tr1. The transistors are arranged to given the correct voltage gain (x2) to ensure that the varactor diode is biassed appropriately to give the correct in capacitance for changing the frequency of the oscillator to track the incoming frequency.

Filter 50 comprises a capacitance C5, a variable resistor VR1, a capacittance C6 in the emitter circuit of Tr2, and a resistor R2 in the emitter circuit of transistor Tr1. These elements, in combination with the phase inversion provided by the amplifier, provide a phase abvance in the feedback signal to compensate for the delays introduced by elements 32, 38, 40, 42, 44 so that in total a delay of $2\pi$ is introduced, equivalent to one cycle of the input signal. The demodulator signal, in the case of a colour video signal is complex with various frequency bands. Normally the signal has its lower frequencies deemphasized and its higher frequencies (where the chrome components reside) preemphasized. Since bright colour frequency components are the most sensitive to noise, the feedback loop contains only the chrome component of the video signal for a PAL signal, a phase advance of 63° is provided; for an NTSC signal, a phase advance of 50° is provided.

Figure 3:
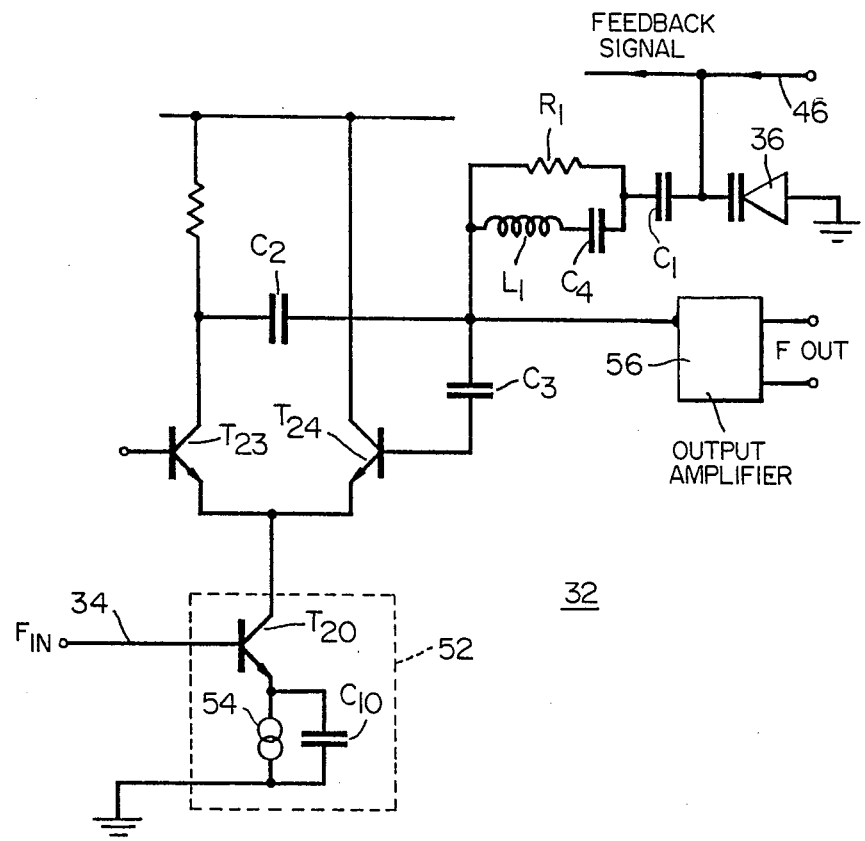
FIG. 3 is a more detailed circuit diagram of the injection locked oscillator/divider of FIG. 2.

Referring now to FIG. 3, the injection-locked divider 32 will be described in detail. The injection-locked divider comprises a mixer input port 34 for an IF input signal coupled to current injection means 52 which comprises a transistor $T_{20}$ and a means for providing direct current which consists of a constant current source 54 and a capacitor $C_{10}$. The base electrode of the transistor $T_{20}$ receives the incoming signal $F_{IN}$ and the current injector provides a direct current to the emitter electrodes of a non-linear amplifying means or multiplier in dependence upon the incoming signal $F_{IN}$. The non-linear amplifying means comprises a long tail pair of transistors $T_{23}$ and $T_{24}$. The combination of transistors $T_{23}$, $T_{24}$ and current injection means 52 form a transconductance mixer.

The collector transistor $T_{23}$ provides an output signal via a capacitor $C_2$ to an output amplifier 56, which provides balanced output signals $F_{out}$. A capacitor $C_3$ coupled between capacitor $C_2$ and the base of transistor $T_{24}$ provides a feedback signal. A resonant circuit comprising resistor $R_1$ in parallel with the series combination of an inductor $L_1$ and a capacitor $C_4$ is coupled to capacitor $C_2$ to provide the basic resonant frequency of the injection locked oscillator/divider. The varactor diode 36 is connected via a capacitor C1 to capacitor $C_4$ and resistor $R_1$ and a feedback signal on line 46 is introduced at the nodal point between diode 36 and capacitor C1.

Thus is operation an input IF signal of about 600 MHz is introduced at input 32 to current injection circuit 52. This circuit 52 functions as a transconductance mixer in combination with differential amplifier $T_{23}$, $T_{24}$, the other input to the mixer being provided by the feedback path of capacitor $C_3$ to feed the output signal to the base of $T_{24}$. Thus the input signal is mixed with a version of the output signal whereby to provide an oscillatory circuit, the frequency of oscillation being determined by the resonant circuit $R_1$, $L_1$, $C_4$. For an input frequency of a 600 MHz, the resonant circuit is chosen to have resonant frequency of 300 MHz so as to provide a sub harmonic of the input signal at the output and hence provide a divide by 2 function. The situations where the input signal has a lower frequency, for example 70 MHz, the resonant circuit may be selected so as to resonate at the input frequency.

Thus the injection locked oscillator/divider comprises a mixer/oscillator combination whose natural frequency, generally known as the centre frequency, is equal to or a sub harmonic of the input carrier frequency. The FM signal to be demodulated is injected into the mixer input port of the device and, provided the frequency deviation of the input signal is not excessively high, an oscillator harmonic will tend to phase lock to the FM input signal. The maximum possible deviation in the output signal from the injection locked oscillator/divider is proportional to the power of the input signal.

An output demodulated video signal is fed back via line 46 in order to tune varactor diode 36. This modulates the resonant frequency of the resonant circuit so that the resonant frequency tracks the means frequency of the incoming signal. This affords advantages in that the injection locked oscillator/divider has an improved injection-lock range, a more symmetric injection range and component values are more easily manufactured. Thus the ILO/D is locked to the input signal not only by reason of the inherent construction and method of operation of the divider which tends to produce a phase locking of the output signal to the input signal, but also by virtue of the feedback signal which alters the centre frequency of the oscillator/divider so that the centre frequency tracks the centre frequency of the input frequency signal thereby to produce a more accurate demodulation.

Figure 2:
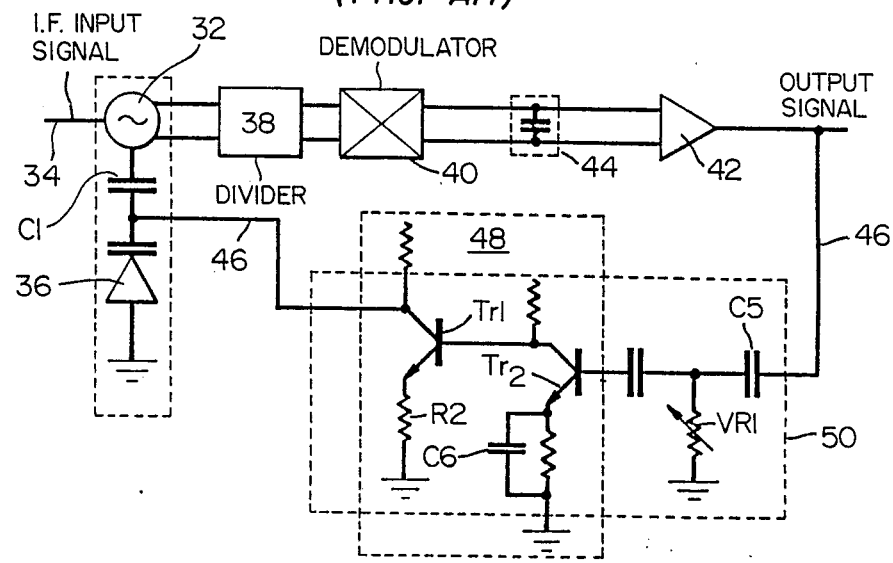
FIG. 2 is a schematic block diagram of a preferred form of FM demodulator according to the invention.

Referring to FIGS. 2 and 3, the output of oscillator/divider 32 provides a signal at the input of the divider 38 which corresponds to the IF input signal, or a sub-harmonic of this signal. The output signal from the divider 38 is a sub-harmonic of the IF input frequency and is fed to the quadrature demodulator 40. The divider 38 is required to ensure that the quadrature demodulator 40 receives an input signal having a frequency which is within the operating range of the device. Typically, quadrature demodulators have a maximum operating frequency of about 150 MHz. If the input signal has an IF frequency of 600 MHz the injection locked oscillator/divider 32 can be arranged to operate as a divider and produce a sub-harmonic output signal of 300 MHz frequency. The division ratio of the divider 8 can then be set at 2 to give an input signal to the quadrature demodulator of 150 MHz frequency, within the operating range of the device.

If the input signal has an IF frequency of 70 MHz, the injection locked oscillator/divider can be arranged to operate as an oscillator to provide an output signal of 70 MHz frequency. The division ratio of the divider 38 can then be set at unity or the divider can be removed from the circuit as the frequency of the output signal from the injection locked oscillator 32 is within the operating range of the quadrature demodulator 40.

The demodulated output signal from the quadrature demodulator 40 is filtered by the filter 44, and amplified by the amplifier 42 to provide the demodulated video output signal which can be displayed on a suitable display unit.

The output signal is also fed along the feedback loop 46 where it is further amplified and filtered by, respectively, the loop amplifier 48 and the loop filter 50 passed to the varactor diode tuning circuit 3C. The feedback signal modulates the injection locked oscillator divider 4 in a predicitive sense such that its natural or centre frequency is constrained to the frequency of the incoming IF signal. This reduces error in the output signal from the injection locked oscillator/divider 32 and so reduces the likelihood of threshold sparklies occurring in the video output. The feedback loop 46 in combination with the level of the IF input signal causes the injection locked oscillator/divider 32 to act as a tracking filter to the IF input signal. Since the lock range, that is, the effective filter bandwidth is controlled by the level of the IF input signal, the FM demodulator can be be arranged such that it has a narrow lock range about a tracking predicted centre frequency of the injection locked oscillator/divider 32. By effective reduction of the noise bandwidth of the IF input signal the threshold level of the FM demodulator is improved.

In practice, the FM demodulator of the present invention has achieved threshold levels of 5dB for narrow-band deviation input signal and 6dB for wideband deviation input signals; an improvement of over 2dB when compared to known systems. With optimisation of the elements in the feedback loop the lock range can be reduced to less than twice the bandwidth of the video information in the IF signal; providing a further extension of threshold level.

It should be emphasized that the circuit according to the invention will operate to receive high frequency IF signals such as 600 MHz or higher and by reason of its frequency division facility enables a conventional demodulator such a quadrature demodulator to be employed within its normal operated frequency (up to 150 MHz). The advantage of using a high IF signal have been set forth above. However, if it is required to operate with a 70 MHz IF signal, the frequency division stages can be adjusted to provide ÷ 1, so that there is no net frequency division.

I claim:

1. A demodulator for frequency modulated signals, the demodulator comprising an injection locked oscillator/divider, the oscillator/divider comprising a mixer/oscillator combination having a center frequency of operation and having an input terminal for receiving an input signal to be demodulated, the oscillator/divider having an output terminal means for providing an output signal, a frequency divider coupled to said output terminal means for dividing the frequency of said output signal, a frequency discriminator coupled to the frequency divider for providing a demodulated output signal, a feedback loop for affording a feedback signal, dependent upon the demodulated output signal, and a tuning circuit means responsive to the feedback signal and coupled to the injection locked oscillator/divider for constraining the center frequency thereof to track the frequency of the input signal, the tuning circuit means comprising a varactor diode tuning circuit for receiving the feedback signal afforded by the feedback loop.

2. An FM demodulator for VHF signals, the demodulator comprising:
   (1) an injection locked oscillator/divider, the oscillator/divider comprising a mixer means having an input port for receiving an input IF signal, an output port means providing an output signal, a first feedback path for feeding back the output signal to the mixer means for mixing the feedback output signal with the input IF signal, a resonant circuit coupled to the output port means for determining the center frequency of the oscillator/divider;

(2) a discriminator coupled for demodulating said output signal to provide a demodulated signal;

(3) a second feedback path coupled to receive said demodulated signal and to provide a feedback signal; and (4) tuning circuit means coupled to said resonant circuit of the oscillator/divider and responsive to the feedback signal of the second feedback path for varying the center frequency of the oscillator/divider whereby the center frequency tracks the input IF signal, wherein said tuning circuit means includes a varactor diode having its anode coupled to receive said feedback signal to vary the capacitance thereof, and a capacitance coupling the varactor diode to the resonance means.

3. An FM demodulator as claimed in claim 2 wherein the mixer means comprises a transconductance mixer including a current injection means for receiving said IF input signal, amplifying means comprising first and secnd transistors connected in common emitter configuration with said current injection means forming a common emitter load, and the collector of the first transistor providing said output signal, said first feedback path coupling said collector to the base of the second transistor.

4. An FM demodulator according to claim 2 wherein said resonant circuit comprises a resistance/capacitance/inductance combination.

5. An FM demodulator according to claim 2 incorporating frequency division means, the frequency division means comprising said injection locked oscillator/divider and a frequency divider coupled to receive the output of the oscillator/divider.

6. An FM demodulator for VHF signals, the demodulator comprising:

(1) an injection locked oscillator/divider, the oscillator/divider comprising a mixer means having an input port for receiving an input IF signal, an output port means providing an output signal, a first feedback path for feeding back the output signal to the mixer means for mixing the feedback output signal with the input IF signal, a resonant circuit coupled to the output port means for determining the center frequency of the oscillator/divider;

(2) a discriminator coupled for demodulating said output signal to provide a demodulated signal;

(3) a second feedback path coupled to receive said demodulated signal and to provide a feedback signal;

(4) tuning circuit means coupled to said resonant circuit of the oscillator/divider and responsive to the feedback signal of the second feedback path for varying the center frequency of the oscillator/divider whereby the center frequency tracks the input IF signal, said tuning circuit means including means for adjusting the resonant frequency of said resonant circuit; and (5) frequency division means coupled to said demodulator, the frequency division means couprising said injection locked oscillator/divider and a frequency divider coupled to receive the output of the oscillator/divider.

* * * * *